United States Patent
Rynne

Patent Number: 5,969,402
Date of Patent: *Oct. 19, 1999

[54] REDUCTION OF DEPLETION SPREADING SIDEWAYS UTILIZING SLOTS

[75] Inventor: D. Michael Rynne, Saratoga, Calif.

[73] Assignee: Advanced Micro Devices, Inc., Sunnyvale, Calif.

[ * ] Notice: This patent is subject to a terminal disclaimer.

[21] Appl. No.: 08/897,165

[22] Filed: Jul. 18, 1997

[51] Int. Cl.$^6$ ................................................. H01L 29/70
[52] U.S. Cl. ................................................. 257/508; 257/517
[58] Field of Search .................................... 257/508, 517

[56] References Cited

U.S. PATENT DOCUMENTS

| | | | |
|---|---|---|---|
| 4,079,408 | 3/1978 | Kwap et al. | 257/517 |
| 4,733,287 | 3/1988 | Bower | 257/508 |
| 4,963,957 | 10/1990 | Ohi et al. | 257/508 |
| 5,017,996 | 5/1991 | Yasuoka | 257/517 |
| 5,485,029 | 1/1996 | Crabbe et al. | 257/517 |
| 5,644,157 | 7/1997 | Iida et al. | 257/508 |
| 5,661,329 | 8/1997 | Hiramoto et al. | 257/517 |
| 5,731,623 | 3/1998 | Ishimaru | 257/517 |

*Primary Examiner*—David B. Hardy
*Attorney, Agent, or Firm*—H. Donald Nelson

[57] ABSTRACT

A semiconductor device and a method of making the semiconductor device, the semiconductor device having a base region wherein the base region is surrounded by a slot. The sideways depletion region of the collector-base junction terminates on the slot thus reducing the sideways spreading of the collector-base depletion region.

9 Claims, 6 Drawing Sheets

REDUCTION OF DEPLETION SPREADING SIDEWAYS UTILIZING SLOTS

BACKGROUND OF THE INVENTION

1. Cross Reference to Related Applications

This application is related to application, Ser. No. 08/897,265, filed on the filing date of this application, ELIMINATION OF RADIUS OF CURVATURE EFFECTS ON P-N JUNCTION AVALANCH BREAKDOWN USING SLOTS, application, Ser. No. 08/897,166, filed on the filing date of this application, entitled USE OF TUNGSTEN FILLED SLOTS AS GROUND PLANE IN INTEGRATED CIRCUIT MANUFACTURE AND ALSO FOR LOW RESISTANCE CONTACT, application, Ser. No. 08/897,167, filed on the filing date of this application, entitled USE OF MULTIPLE SLOTS SURROUNDING BASE REGION OF A BIPOLAR JUNCTION TRANSISTOR TO INCREASE CUMULATIVE BREAKDOWN VOLTAGE and application, Ser. No. 08/897,082, filed on the filing date of this application, entitled USE OF SLOTS IN DEEP ISOLATION AND COLLECTOR PICKUP REGIONS FOR MINIMIZATION OF SUB-COLLECTOR UP-DIFFUSION.

2. Field of the Invention

This invention relates generally to high voltage semiconductor devices. More particularly, this invention relates to high voltage semiconductor devices in which sideways depletion spreading is reduced by utilizing slots.

3. Discussion of the Related Art

The bipolar transistor is an electronic device with two pn junctions in very close proximity. There are three device regions: an emitter region, a base region, and a collector region. The two pn-junctions are known as the emitter-base (EB) junction and the collector-base (CB) junction. Modulation of the current in one pn-junction by means of a change in the bias of the other nearby pn-junction is called bipolar-transistor action. Because the mobility of minority carriers (electrons) in the base region of npn transistors is higher than that of holes in the base of pnp transistors, higher frequency operation and higher speed performances can be obtained with npn devices. For this reason, the following discussion will be in terms of npn transistors but it is to be understood that the discussion is applicable to pnp transistors as well.

The desired device characteristics of bipolar transistors include: high current gain, high frequency ac operation, fast switching speed, high device-breakdown voltages, minimum device size (to achieve high functional density) and high reliability of device operation. In order for high-frequency ac performance and fast switching speed to be achieved, the parasitic resistances of the transistor; $R_E$, $R_B$, and $R_C$, and the parasitic junction capacitances; $C_{EB}$, $C_{CB}$, and $C_{CB}$ must be minimized. In addition, high-level injection effects, for example, the Kirk effect should be avoided. For faithful amplification of ac signals, the Early voltage must be high.

Modern high-speed bipolar junction transistors (BJTs) are generally constrained by the competing concerns of high β (forward current gain) and high base punch-through resistance. Punch-through refers to the effect wherein the neutral base width is reduced to zero at a sufficiently high collector-base voltage, $V_{cb}$. With the neutral base reduced to zero, the collector-base depletion region is in direct contact with the emitter-base depletion region. At this point, the collector is effectively short-circuited to the emitter, and as a result a large current flows.

The effects of beta and punch-through voltage are both coupled directly through the base charge, $Q_b$. The total charge in the base region of a bipolar transistor is given by the product of the doping concentration, $N_A$, and the base width, $W_b$. Lowering $Q_b$ raises β but also lowers punch-through voltage at the same time. For the opposite condition, raising $Q_b$ lowers the β but results in a higher punch-through voltage. The trade-off between high β and high punch-though resistance has been a fundamental feature of silicon bipolar junction transistors for many years.

Researchers have attempted to decouple the competing effects of β and punch-through voltage by altering the band gap characteristics of the emitter, the base, or both. lowering the band gap at the base, for instance, by the use of silicon germanium alloys has produced favorable β values with acceptable punch-through voltages. Alternatively, experiments in utilizing silicon carbide alloys to raise the band gap of the emitter region have also produced favorable results. Work is continuing in the semiconductor design field to further increase the performance of these devices by engineering the band gap.

While efforts to engineer the band gap of the emitters and base regions have produced impressive results, these results have not come without certain costs. One of the primary drawbacks of using alloy semiconductors such as silicon germanium or silicon carbide is that forming such allows generally require the use of exotic processing equipment. Typically, heterojunction epitaxial layers are grown using a technique known as molecular beam epitaxy (MBE). In this method the substrate is held in a high vacuum while molecular or atomic beams of the constituent atoms impinge upon its surface. The main problems with MBE machines is that they are characterized by extremely slow growth rates (approximately 1 micron/hour) and are very expensive and very difficult to operate in a manufacturing environment. Moreover, techniques such as MBE for forming heterojunction alloys are generally not compatible with modern processing requirements and structures. In light of these limitations, advanced epitaxial growth techniques like MBE have been limited to research facilities or to specific applications where the level of integration is severely limited and the manufacturing volumes are likewise small. Thus, the goal of simultaneously achieving high β and high punch-through voltage in a bipolar transistor manufactured using conventional silicon processing equipment and techniques has not yet been accomplished.

Another limiting factor in some applications is that there is a requirement for a higher density of devices in a given surface area of the semiconductor chip. In some high-voltage applications, the density is limited by the requirement to provide a sufficiently large depletion zone that necessarily increases as the voltage increases. In junction-isolated SBC transistors, the packing density is relatively low since so much silicon area is taken up by inactive isolation regions. Although the window defining the isolation diffusion may be a minimum size at the surface, the total width of the isolation region there is determined by lateral diffusion. For example, if the epitaxial layer is 12 microns thick and the minimum feature size is 3 microns, the isolation region will approach 24 microns in width (assuming that lateral diffusion is approximately 80% of the vertical diffusion). Thus, the width of the isolation region ends up about twice the thickness of the epitaxial layer in order for the acceptor dopants to penetrate through this layer. In addition, as the operating voltages increase the depletion zone must increase to avoid punch-through or breakdown.

Therefore, what is needed is a semiconductor device that prevents the sideways spreading of the collector-base depletion that preserves a high breakdown voltage.

SUMMARY OF THE INVENTION

The present invention is directed to a semiconductor device having a base region surrounded by a slot. The base region and the surrounding slot are formed in an epitaxial region that is grown on a substrate region. A buried layer is formed in a portion of the interface between the substrate region and the epitaxial region. A collector region is formed on an opposite side of a portion of the slot from the base region. The collector region extends through the epitaxial region and merges with the buried layer. Isolation structures are formed to isolate the base region, collector region and the slot. A portion of the slot extends through the epitaxial region and extends into the substrate region and a second portion of the slot extends through the epitaxial region and extends into a surface of the buried layer.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to a specific embodiment of the present invention that illustrates the best mode presently contemplated by the inventors for practicing the invention and which is set forth in the accompanying drawings. The drawings referred to in this description are diagrammatic and, for clarity, are not drawn to scale. The drawings illustrate only one portion of an integrated circuit fabricated in accordance with the present invention. For each of the descriptions provided below, a typical manufacturing process is given for each step. It should be appreciated that other manufacturing processes could be used and other manufacturing processes would become apparent to a person skilled in the art and, therefore, the recitation of a particular manufacturing process should not be construed to be limiting. It is noted that in some instances conventions such as p– and n+ are given by way of example, in which case the concentrations are not critical to the implementation of the present invention. The corresponding dopant types and concentrations would be apparent to a person skilled in the relevant art. For those instances in which the concentration is critical to the implementation of the present invention, the value of the concentration is specified.

FIGS. 1–4 show selected initial steps in the manufacture of a standard-buried-collector (SBC) npn semiconductor device. The selection of an SBC npn semiconductor device is for convenience only and is not meant to restrict the invention only to SBC npn semiconductor devices as the concepts of the present invention are applicable to other types of semiconductor devices. FIGS. 5–8 show selected continuing steps in the manufacture of the semiconductor device shown in FIGS. 1–4 in which a semiconductor device as known in the prior art is formed. FIGS. 9–12 show selected continuing steps in the manufacture of the semiconductor device shown in FIGS. 1–4 in which a semiconductor device in accordance with the present invention is formed. In the figures, there has not been an attempt to show any of the features to an exact scale. In addition, the vertical dimension is somewhat larger so that the junctions and film thicknesses are actually smaller than they appear in the figures in relation to the horizontal dimension of the various elements.

Figure 1:
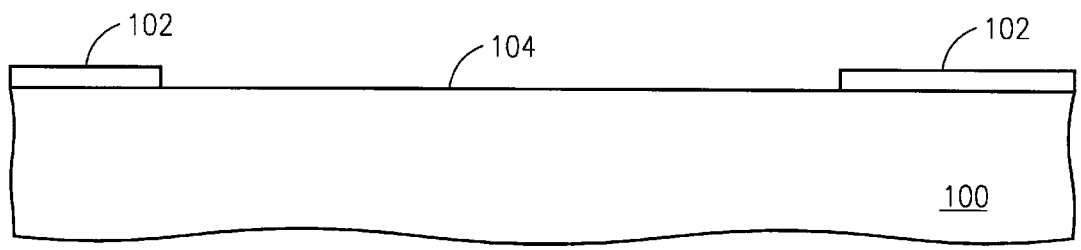
FIGS. 1–4 show selected initial steps in the manufacture of a semiconductor device.

FIG. 1 shows a lightly p– type doped silicon substrate 100 with an oxide layer 102 that has been formed on the surface of the substrate 100 and etched to expose a portion of the surface 104 of the substrate 100. The oxide layer 102 is typically formed by exposing the surface of the substrate 100 to a wet oxidation atmosphere and a high temperature cycle. The substrate doping is selected to be light enough to minimize the parasitic collector-to-substrate depletion-layer capacitance, but heavy enough to prevent it from being changed to n– type during subsequent processing.

Figure 2:
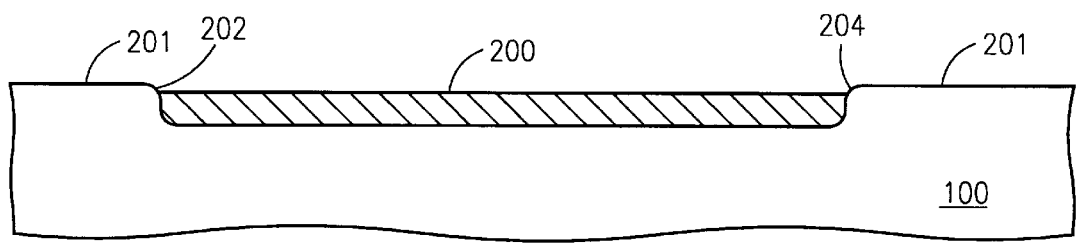

FIG. 2 shows the portion of the substrate 100 shown in FIG. 1 with a layer 200 formed in the portion of the surface 104 defined by the oxide layer 102 shown in FIG. 1 in which a window has been etched. The layer 200 is formed by heavy n+ type diffusion or ion implantation and will become a buried layer during further processing. The buried layer is also called a subcollector. The surface 104 of the substrate 100 is exposed to an appropriate atmosphere containing the selected dopant ions or ion implantation at approximately 30 keV and approximately $10^{15}$ atoms/cm$^2$. In order to minimize the further diffusion of the layer 200 during subsequent processes that are conducted at high temperature, dopants with relatively small diffusion constants such as arsenic and antimony are used to form the layer 200. The highly doped layer 200 provides a low resistance path from the active part of the transistor, to be discussed later, to the collector contact, which will also be discussed later. The oxide layer 102 is removed exposing the surface 201 of the substrate 100. An anneal/drive-in procedure is performed in an oxidizing ambient that causes a new oxide to be formed on the wafer surface. After the diffusion to form the layer 200 a step of approximately 100–200 nm remains in the substrate 100 at the edges of the layer 200. The step is indicated at 202 and 204 and is formed because of the unequal thicknesses of the oxides that have grown on the respective underlying materials. The steps propagate through the epitaxial layer and become the alignment marks that allow subsequent mask levels to be aligned with the buried layer.

Figure 3:
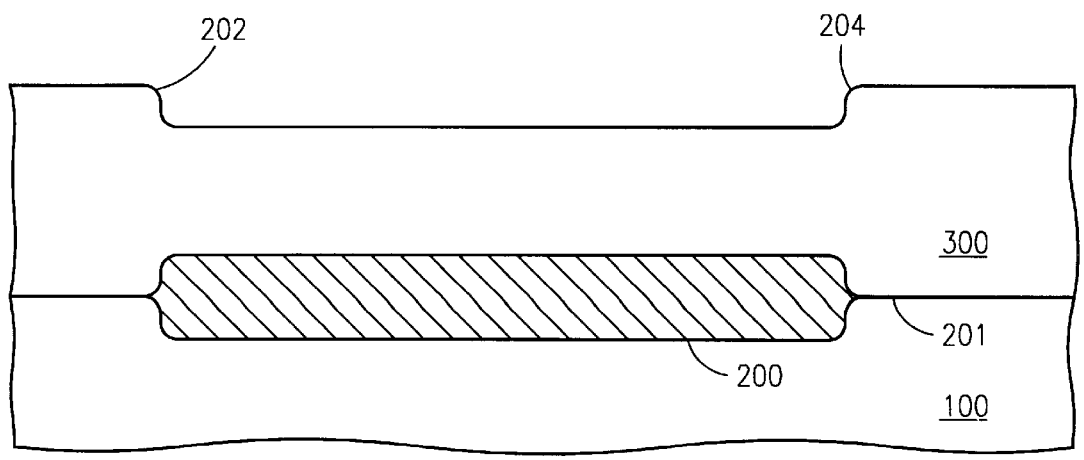

FIG. 3 shows an epitaxial layer 300 grown on the surface of the entire wafer, including the surface 201 of the substrate 100 and the surface of the layer 200. The epitaxial layer 300 is a lightly doped n– type layer and under proper conditions the epitaxial layer 300 is a single-crystal layer that continues the crystal structure of the original substrate. This makes the epitaxial layer 300 suitable for the fabrication of devices. The dopant typically used to form the lightly doped (approximately $10^{15}$–$10^{16}$ atoms/cm$^3$) n– type epitaxial layer is arsenic because of its small diffusivity. The minimum thickness and maximum doping concentration of the epitaxial layer are determined by the avalanche breakdown and reach through limitations on the value of $BV_{CEO}$. During the growth of the epitaxial layer the steps indicated at 202, 204 are shown replicated on the surface of the epitaxial layer 300. The presence of the steps 202 and 204 allows subsequent mask levels to be aligned to the layer 200, which is now buried. During the growth of the epitaxial layer 300, which is done at a high temperature, the buried layer 200 becomes larger because of diffusion of the dopants used to form the buried layer 200. As discussed above, dopants with a low diffusion rate are typically used to minimize the subsequent growth of the buried layer 200.

Figure 4:
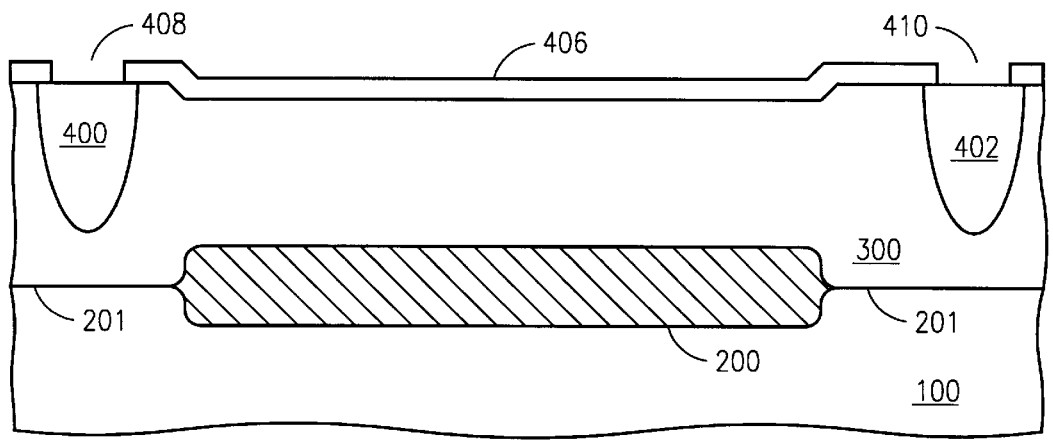
Figure 5:
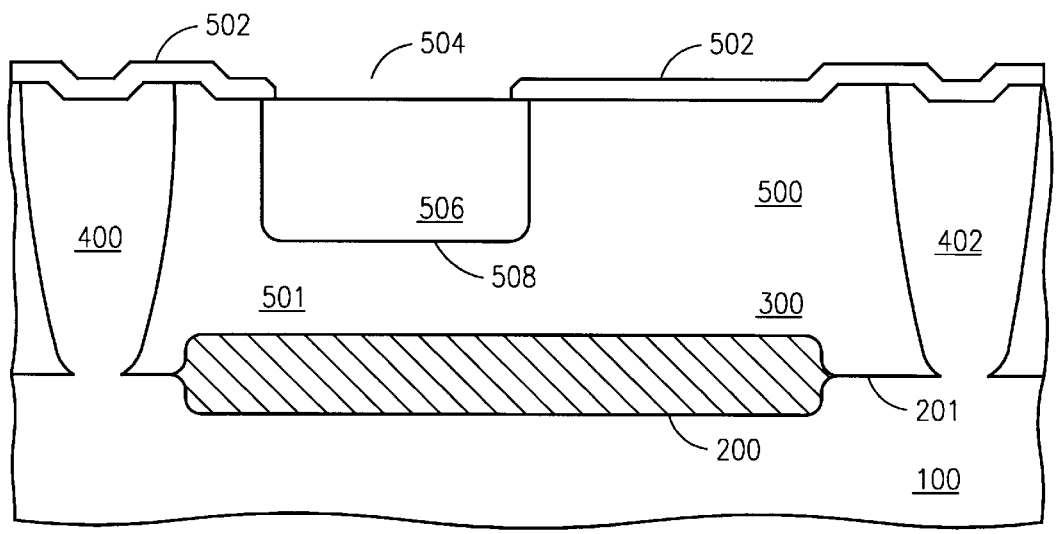
FIGS. 5–8 show selected continuing steps in the manufacture of the semiconductor device shown in FIGS. 1–4 to obtain a prior art semiconductor device.

FIG. 4 shows two isolation structures 400 and 402 formed in the epitaxial layer 300. The isolation structures are formed by growing an oxide layer 406 on the surface of the epitaxial layer 300 and opening windows, indicated at 408 and 410 in the oxide layer 406 at locations where isolation structures are to be formed. A deep p+ type diffusion process, typically using boron, is then performed. The purpose of the isolation structures is to isolate the collectors of the transistors from one another with reverse-biased pn junctions. Thus, the acceptor concentration in the isolation regions must be higher than the donor concentration in the epitaxial layer, and the junction depth (the depth of the isolation structures) must be at least equal to the depth of the epitaxial layer in order for complete isolation to be achieved. As shown in FIG. 4, p+ isolation structures 400 and 402 are formed. Initially, the p+ isolation structures 400 and 402 do not extend to the substrate layer 100. However, subsequent high-temperature processes will cause the p+ isolation diffusion making up the isolation structures 400 and 402 to reach as far as the original substrate surface 201 as shown in FIG. 5. It is customary to "overdrive" the isolation diffusion beyond the depth of the epitaxial layer to prevent the possibility that the depletion region could extend beneath the isolation diffusion. Once the p+ isolation diffusion reaches or extends beyond the original substrate layer, there will be an n– type island completely surrounded by p+ type material. This can be clearly seen in FIG. 5. It should be appreciated by one of ordinary skill in the art, that the figures show a cross-section of the device and the structures are all three-dimensional. For example, it should be appreciated that the isolation structures indicated at 400 and 402 surround the region 500 of the device shown in FIG. 5.

FIG. 5 shows the device shown in FIG. 4 with the oxide layer 406 removed and a new oxide layer 502 formed on the device. A base diffusion mask is used to open a window 504 in the oxide and a p– type diffusion process is performed to form the base region 506 of the transistor. The formation of the base region is one of the most critical processes in bipolar transistor fabrication. The base must be aligned so that the collector-base and collector-substrate depletion regions do not merge, following diffusion at the surface. The minimum allowable spacing between the isolation regions and the base region is determinable from knowledge of the applied voltages and the epitaxial-layer doping concentration. The width of the window 504 is limited by the theoretically predicted width of the sideways depletion region that is associated with the collector-base junction 508 and will be discussed in conjunction with FIG. 6. The collector-base junction 508 does not reach as far as the buried layer 200. As a result the region 501 between the base region 506 and the buried layer 200 remains lightly doped, which gives more ideal characteristics for the transistor and also provides a higher breakdown voltage.

Figure 6:
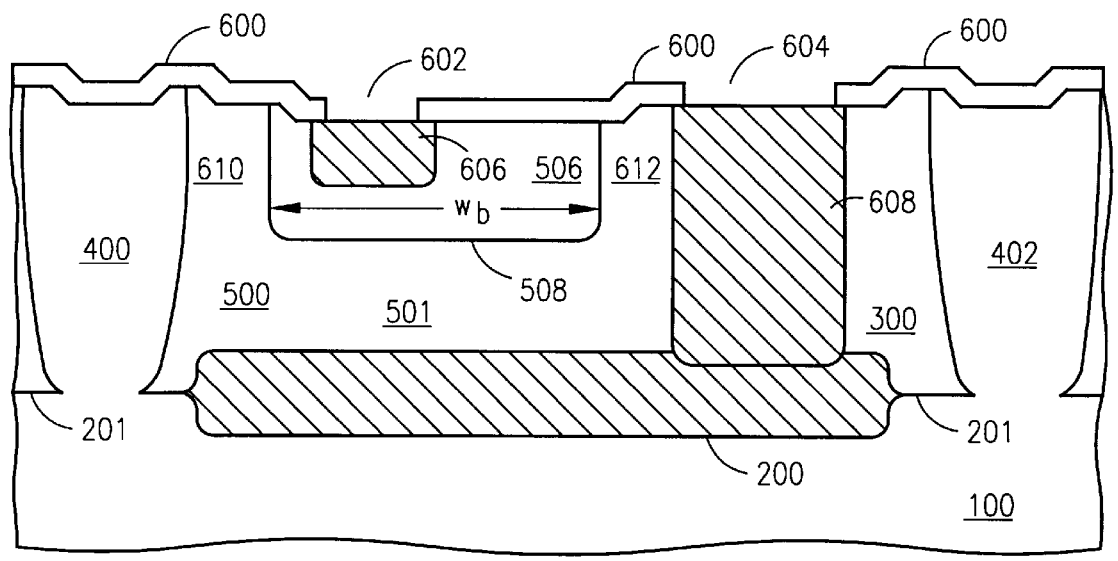

FIG. 6 shows the device shown in FIG. 5 with an oxide layer 600 formed on the surface of the device. In one type of prior art device, a window at 602 is opened in the oxide layer 600 for an emitter diffusion process and a window at 604 is opened at the same time in the oxide layer 600 for a collector diffusion process. In this type of device, the combined emitter and collector diffusion process is a shallow, high-concentration n– type diffusion and is performed in an oxidizing ambient so that oxide covers the entire wafer after the diffusion is completed. In another type of device, the emitter diffusion and collector diffusion process shown in FIG. 6 are done in separate diffusion processes. If the collector region 608 is to extend to the buried layer 200 it may be necessary to have the emitter diffusion process separate from the emitter diffusion process so that the emitter diffusion does not diffuse too deeply into the base region 506. The deep diffusion of the collector region is necessary in some applications because the value of the $R_C$ (the resistance of the collector to base path) is too high. In junction-isolated SBC devices, the collector contact is typically formed by means of a diffusion process. In other types of devices, an ion implantation process can be used. Phosphorus is chosen for this application since it is a faster-diffusing impurity than arsenic. As can be appreciated, an additional mask must be used to allow the dopant to be selectively introduced only into the collector region. The emitter diffusion process forms the emitter region 606 and the collector diffusion process forms the collector region 608.

In each type of prior art device, the width $W_b$ of the base region 506 is dependent upon the position of the isolation region 400 and the position of the collector region 608 is determined by the theoretically predicted values of the width of the depletion regions 610 and 612. Some of the factors that are considered in the determination of the width w of the depletion regions are the doping of the region 500, the doping of the base region 506, the operating voltage and the desired breakdown voltage of the device. Basically, as the operation voltage is increased the width of the depletion regions must be increased.

Figure 7:
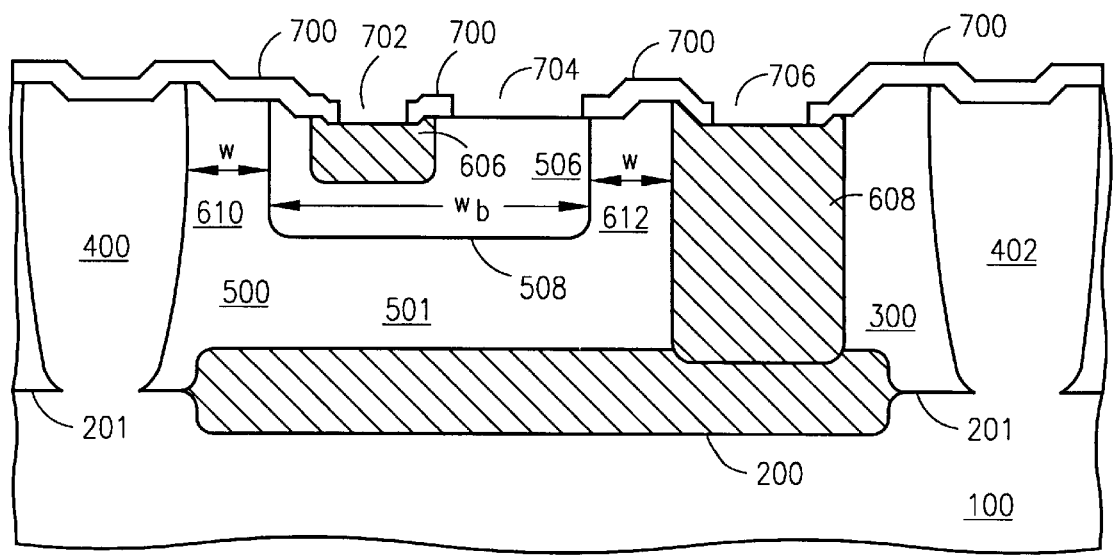

FIG. 7 shows the device shown in FIG. 6, after the contact mask has been utilized to open windows in the oxide layer 700. There is a window 702 to the emitter region 606, a window 704 to the base region 506, and a window 706 to the collector region 608. The windows 702, 704, and 706 are for the purpose of allowing electrical contacts to be made to the emitter region, the base region and the collector region.

Figure 8:
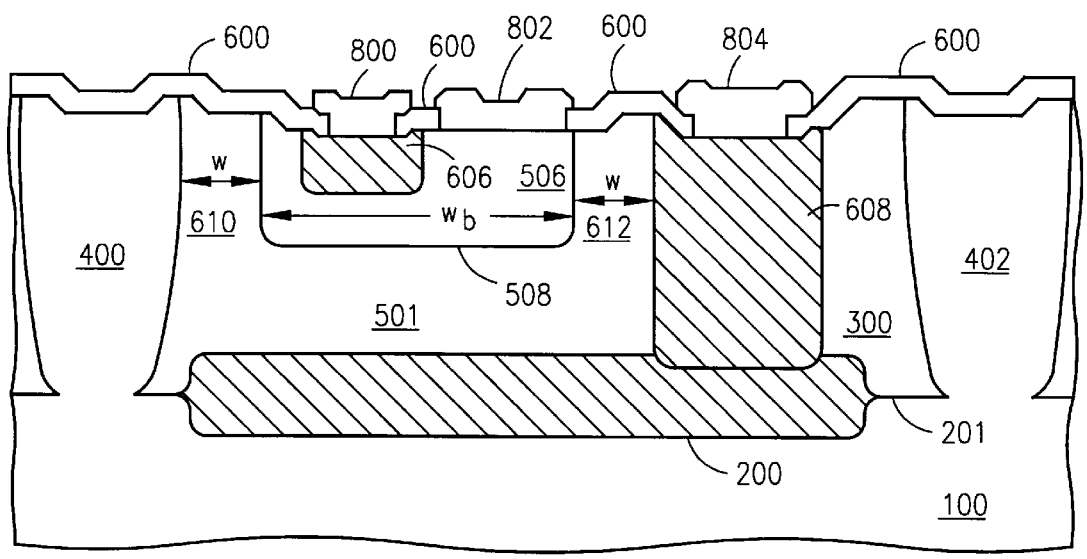

FIG. 8 shows the device shown in FIG. 7, with an electrical contact 800 to the emitter region 606, an electrical contact 802 to the base region 506, and an electrical contact 804 to the collector region 608.

Figure 9:
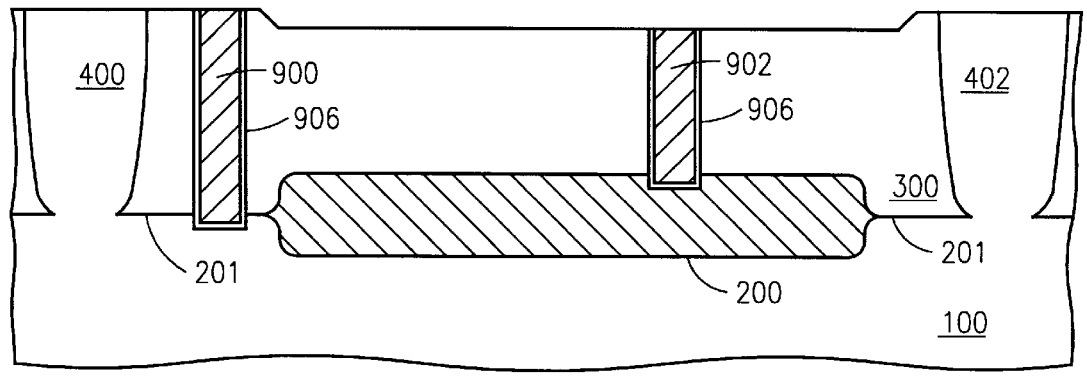
FIGS. 9–13 show selected continuing steps in the manufacture of the semiconductor device shown in FIGS. 1–4 to obtain a semiconductor device in accordance with the present invention.

FIG. 9 shows the device shown in FIG. 4 with the oxide layer 406 removed and with a slot formed in the region 500 with a first portion of the slot indicated at 900 and a second portion of the slot indicated at 902. The depth of the slot is selected so that it will extend either to the substrate 100 in case of slot portion 900 and to the buried layer 200 in the case of slot portion 902. One method of forming the slot is to provide a protection layer consisting of a layer of thermal oxide, a deposited layer of silicon nitride, and a deposited layer of oxide. A layer of photoresist is deposited and a photoresist mask patterns the photoresist and a reactive ion etch (RIE) with chemistry etches through the protection layer, the oxide and nitride to the photoresist. The photoresist is removed and reactive ion etching with chemistry is used to etch the silicon slot. A liner material 906 is formed on the walls of the slot. The liner material depends upon the slot material and could be thermal oxide or silicon nitride. The slot is filled with a material such as polysilicon. The slot material is planarized using a chemical mechanical planarization process. Any well-known method of making slots in a silicon device can be used to form the slots.

Figure 10:
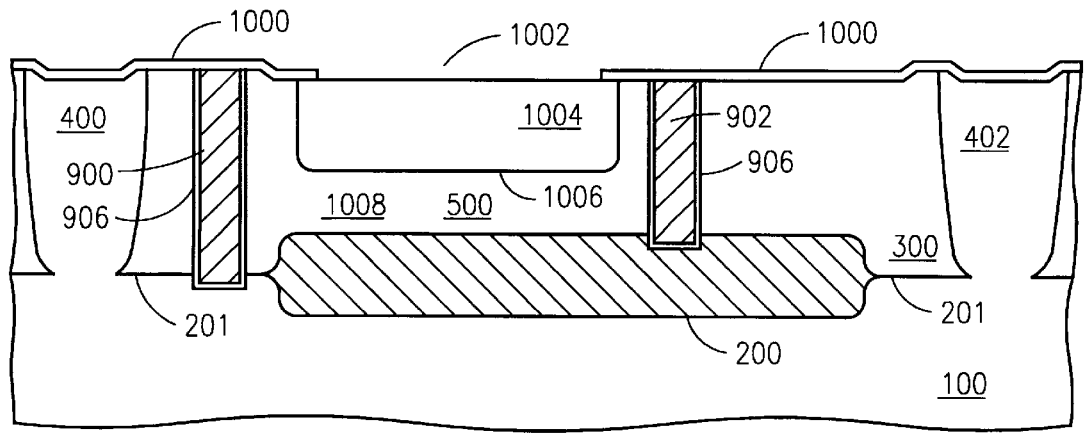

FIG. 10 shows the device shown in FIG. 9 with an oxide layer 1000 formed on the surface of the device. A base diffusion mask is used to open a window 1002 in the oxide layer 1000 and a p– type diffusion process is performed to form the base region 1004 of the transistor. The p– type diffusion process to form base region 1004 is controlled to ensure that the boundary 1006 of the base region 1004, which will be the collector-base junction of the device, does not extend to the buried layer 200. As a result the region 1008 between the base region 1004 and the buried layer 200 remains lightly doped, which provides a device with more ideal characteristics for the transistor and also provides a higher breakdown voltage. The slot portions 900 and 902 reduce the sideways depletion regions 610 and 612 by allowing the depletion regions to terminate on the slot portions 900 and 902. The effects of the slots on the dimensions of the device will be discussed in conjunction with FIG. 11.

Figure 11:
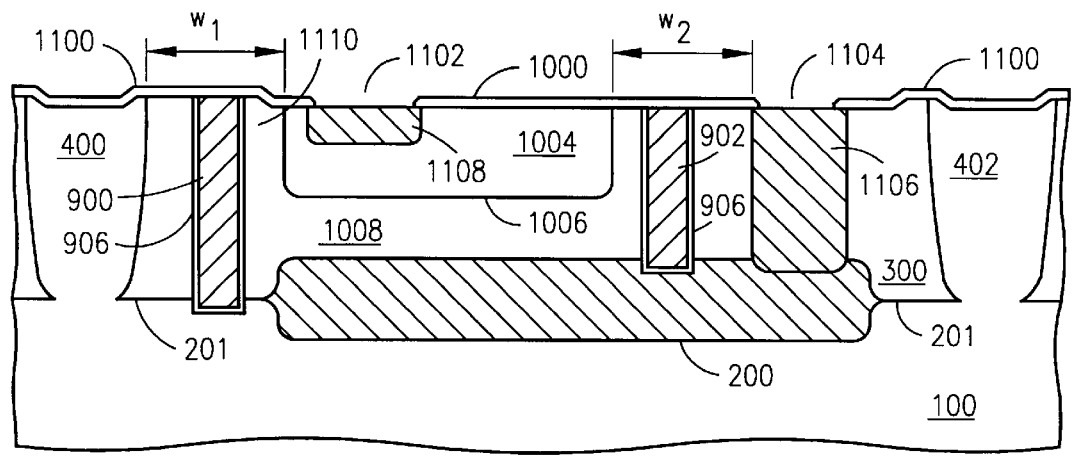

FIG. 11 shows the device shown in FIG. 10 with an oxide layer 1100 formed on the device. In one type of prior art device, a window at 1102 is opened in the oxide layer 1100 for an emitter diffusion process and a window at 1104 is opened in the oxide layer 1100 for a collector diffusion process. In this type of device, the combined emitter and collector diffusion process is a shallow, high-concentration n– type diffusion process and is performed in an oxidizing ambient so that oxide covers the entire wafer after the diffusion process is completed. In another type of device, the emitter diffusion process and the collector diffusion process are done in separate diffusion processes. If the collector region 1106 is to extend to the buried layer 200 as shown in FIG. 11, it may be necessary to have the emitter diffusion process separate so that the emitter diffusion does not diffuse too deeply into the base region 904. The deep diffusion of the collector regions is necessary in some applications because the value of the RC (the resistance of the collector to base path) is too high. In junction-isolated SBC devices, the collector contact is typically formed by means of a diffusion process. In other types of devices, an ion implantation process can be used. Phosphorus is typically chosen for this application since it is a faster-diffusing impurity than arsenic. As can be appreciated, an additional mask must be used to allow the dopant to be selectively introduced only into the collector region. The emitter diffusion process forms the emitter region 1108 and the collector diffusion process forms the collector region 1106.

The effect of the slot formed adjacent to the base region is as follows. Because the depletion regions 1110 and 1112 now terminate on slot portions 900 and 902, respectively, the widths, $w_1$ and $w_2$, are less than the widths w (FIG. 7). The presence of the slots allow the device to either have a higher breakdown voltage for the same dimension or less or alternately, to have the same breakdown voltage for a smaller dimension.

Figure 12:
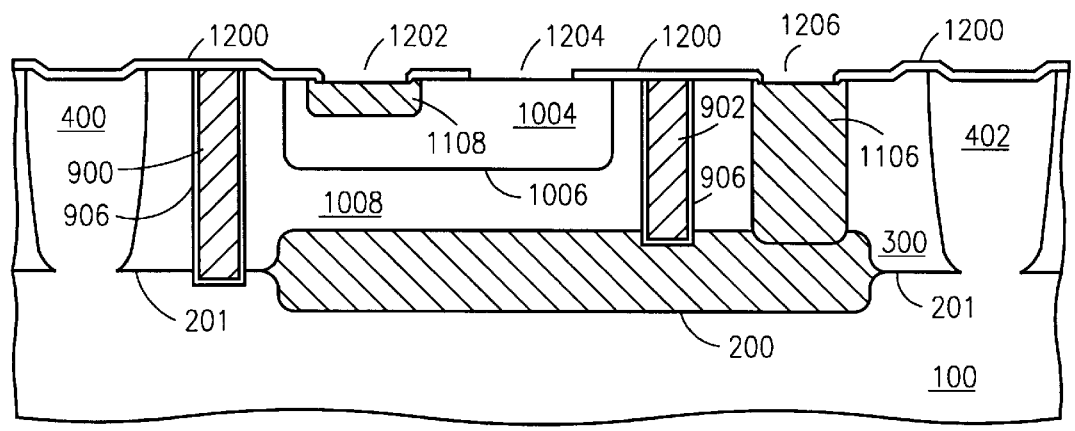

FIG. 12 shows the device shown in FIG. 11, after the contact mask has been used to open windows in the oxide layer 1200 after the oxide layer 1100 has been removed. There is a window 1202 to the emitter region 1108, a window 1204 to the base region 1004 and a window 1206 to the collector region 1106. The windows 1202, 1204, and 1206 are for the purpose of allowing electrical contacts to the emitter, base and collector regions.

Figure 13:
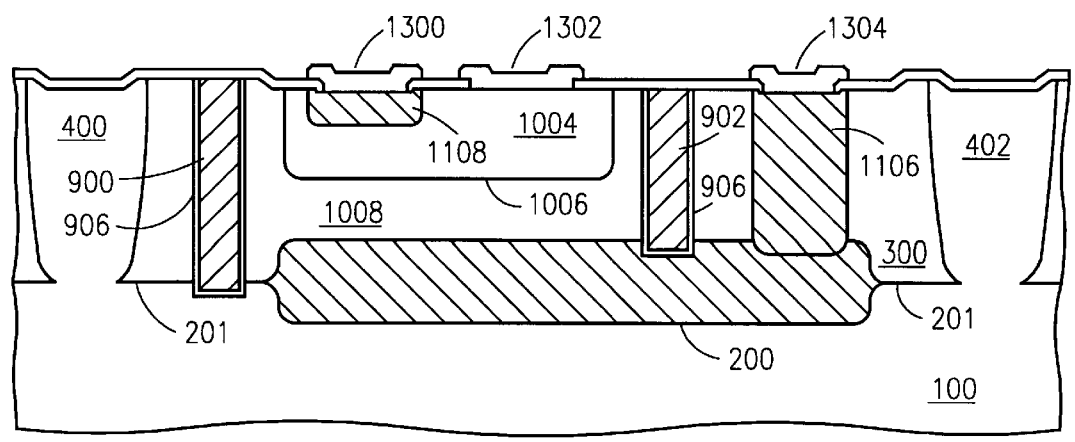

FIG. 13 shows the device shown in FIG. 12 with an electrical contact 1300 to the emitter region 1108, an electrical contact 1302 to the base region 1004, and an electrical contact 1304 to the collector region 1106.

Figure 14:
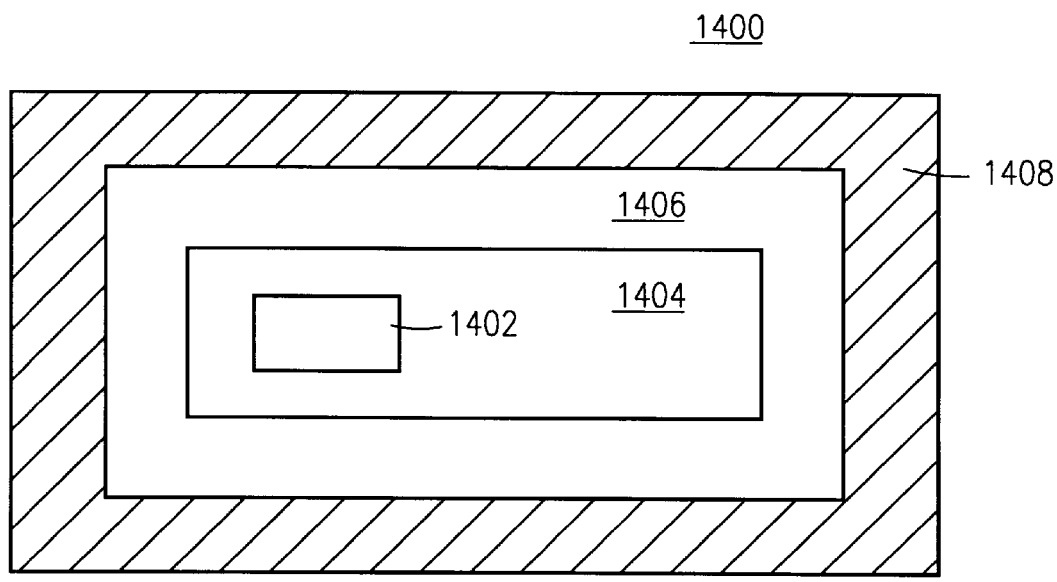
FIG. 14 shows a top view showing the structure of a semiconductor device in accordance with the present invention.

FIG. 14 is a top view of a portion of a semiconductor device 1400 showing an emitter region 1402, a base region 1404, a surrounding epitaxial region 1406, and a slot 1408.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What I claim is:

1. A semiconductor device having a base region wherein the base region is surrounded by a slot filled with tungsten.

2. The semiconductor device of claim 1, wherein the base region and the surrounding slot are formed in an epitaxial region.

3. The semiconductor device of claim 2, wherein the epitaxial region is grown on a substrate region.

4. The semiconductor device of claim 3, further comprising a buried layer region formed on a portion of an interface between the substrate region and the epitaxial region.

5. The semiconductor device of claim 4, further comprising a collector region formed in the epitaxial region.

6. The semiconductor device of claim 5, further comprising isolation structures formed around the epitaxial region and extending through the epitaxial region and merging with the substrate region thereby isolating the base and collector region.

7. The semiconductor device of claim 6, further comprising an emitter region formed in the base region.

8. The semiconductor device of claim 7, wherein the collector region extends through the epitaxial region and merges with the buried layer region.

9. The semiconductor device of claim 8, wherein a first portion of the slot extends through the epitaxial region and extends into the substrate region and a second portion of the slot extends through the epitaxial region and extends into a surface of the buried layer region.

\* \* \* \* \*